(12) United States Patent
Masuda et al.

(10) Patent No.: US 11,539,361 B2
(45) Date of Patent: Dec. 27, 2022

(54) SEMICONDUCTOR DEVICE SIGNAL TRANSMISSION CIRCUIT FOR DRIVE-CONTROL, METHOD OF CONTROLLING SEMICONDUCTOR DEVICE SIGNAL TRANSMISSION CIRCUIT FOR DRIVE-CONTROL, SEMICONDUCTOR DEVICE, POWER CONVERSION DEVICE, AND ELECTRIC SYSTEM FOR RAILWAY VEHICLE

(71) Applicant: Hitachi Power Semiconductor Device, Ltd., Hitachi (JP)

(72) Inventors: Toru Masuda, Tokyo (JP); Seiichi Hayakawa, Hitachi (JP); Yuji Takayanagi, Hitachi (JP); Takae Shimada, Tokyo (JP); Takashi Wada, Hitachi (JP)

(73) Assignee: Hitachi Power Semiconductor Device, Ltd., Hitachi (JP)

( * ) Notice: Subject to any disclaimer, the term of this patent is extended or adjusted under 35 U.S.C. 154(b) by 116 days.

(21) Appl. No.: 17/172,571

(22) Filed: Feb. 10, 2021

(65) Prior Publication Data
US 2021/0288640 A1 Sep. 16, 2021

(30) Foreign Application Priority Data

Mar. 11, 2020 (JP) .............................. JP2020-041617

(51) Int. Cl.
*H03K 17/16* (2006.01)
*H02M 1/32* (2007.01)
(Continued)

(52) U.S. Cl.
CPC .......... *H03K 17/162* (2013.01); *B60L 13/006* (2013.01); *H02M 1/32* (2013.01); *B60L 2200/26* (2013.01); *H02M 1/0054* (2021.05)

(58) Field of Classification Search
CPC .... H02M 1/32; H02M 1/0054; H03K 17/162; B60L 2200/26
See application file for complete search history.

(56) References Cited

U.S. PATENT DOCUMENTS 7,116,153 B2* 10/2006 Pai ..................... H03K 17/6877
327/427
9,929,647 B1* 3/2018 Jeong ................... H02H 7/0838
(Continued)

FOREIGN PATENT DOCUMENTS

| EP | 3 316 463 A1 | 5/2018 |
| JP | 2011-188383 A | 9/2011 |
| JP | 2018-7373 A | 1/2018 |

OTHER PUBLICATIONS

German-language Office Action issued in German Application No. 102021101696.7 dated May 10, 2022 with partial English translation (16 pages).

*Primary Examiner* — Rafael O De Leon Domenech
(74) *Attorney, Agent, or Firm* — Crowell & Moring LLP

(57) ABSTRACT

To provide a semiconductor device signal transmission circuit for drive-control, a method of controlling a semiconductor device signal transmission circuit for drive-control, a semiconductor device, a power conversion device, and an electric system for a railway vehicle capable of preventing malfunction due to noise while speeding up or reducing loss of a switching operation. The semiconductor device signal transmission circuit for drive-control that is connected between a semiconductor device constituting an arm in a power conversion device and a drive circuit configured to drive the semiconductor device, including: an inductor; and an impedance circuit including a switch and connected in parallel with the inductor.

8 Claims, 10 Drawing Sheets

(51) Int. Cl.
*B60L 13/00* (2006.01)
*H02M 1/00* (2006.01)

(56) References Cited

U.S. PATENT DOCUMENTS

| | | | |
|---|---|---|---|
| 2009/0224705 A1* | 9/2009 | Jobard | B60L 7/06 |
| | | | 318/380 |
| 2011/0221480 A1 | 9/2011 | Ikeda | |
| 2012/0306545 A1* | 12/2012 | Machida | H02M 3/1588 |
| | | | 327/109 |
| 2013/0088279 A1* | 4/2013 | Shimano | H03K 17/284 |
| | | | 327/401 |
| 2019/0319531 A1 | 10/2019 | Maerz et al. | |

* cited by examiner

SEMICONDUCTOR DEVICE SIGNAL TRANSMISSION CIRCUIT FOR DRIVE-CONTROL, METHOD OF CONTROLLING SEMICONDUCTOR DEVICE SIGNAL TRANSMISSION CIRCUIT FOR DRIVE-CONTROL, SEMICONDUCTOR DEVICE, POWER CONVERSION DEVICE, AND ELECTRIC SYSTEM FOR RAILWAY VEHICLE

CLAIM OF PRIORITY

The present application claims priority from Japanese patent application JP 2020-041617 filed on Mar. 11, 2020, the content of which is hereby incorporated by reference into this application.

BACKGROUND OF THE INVENTION

1. Field of the Invention

The present invention relates to a signal transmission circuit for drive-control that connects a semiconductor device and a drive circuit, a method of controlling the signal transmission circuit for drive-control, and a semiconductor device, a power conversion device, and an electric system for a railway vehicle that use the signal transmission circuit for drive-control.

2. Description of the Related Art

In devices such as industrial equipment, electric railway vehicles, hybrid vehicles, and electric vehicles, a power conversion device is widely used for power control and motor control. The power conversion device includes a power semiconductor module or power semiconductor device, a capacitor, and the like which are electric components, a wiring connecting the electric components, and a heat sink for dissipating heat generated due to power loss of the electric components, and supplies power to a load such as a motor or a system wiring.

Since the power semiconductor module and the power semiconductor device constituting a main circuit of the power conversion device control an output current of the power conversion device, conduction loss and the switching loss occur. If these power losses are reduced, a size of the heat sink is reduced. Accordingly, a size of the power conversion device can be reduced, or additional components for higher functionality can be disposed in a vacant space. For example, it is possible to reduce a volume of the power conversion device disposed under a floor of an electric railway vehicle, and provide a storage battery in the obtained vacant space, thereby improving energy regeneration performance. For this reason, it is required to further reduce the conduction loss and the switching loss.

As a method of reducing the switching loss, there is a method in which a gate drive current is increased at the time of switching. In this case, a value of a gate drive resistor is set to be small. However, due to the reduction in the value of the gate drive resistor, an increase in a rated output current of a gate drive circuit is required, and a damping effect by using resistive component on resonance in a path from the gate drive circuit to the power semiconductor module or the power semiconductor device is weakened, and resonance is likely to occur. When the resonance grows, a voltage vibration exceeding a gate voltage having the lowest voltage rating occurs in the power semiconductor module or the power semiconductor device. As a result, a gate portion of a semiconductor device is deteriorated or damaged, and reliability of the power semiconductor module and the power semiconductor device is reduced.

As a related art related to gate drive with respect to such loss reduction and resonance, techniques disclosed in JP-A-2018-7373 (PTL 1) and JP-A-2011-188383 (PTL 2) are known.

In the technique disclosed in PTL 1, a variable control capacitance is connected between a gate and a source of a switching element, and a capacitance between the gate and the source is changed according to an operation period with a gate drive signal generated by a gate drive pulse circuit as a timing reference. In a duration in which a gate current becomes the maximum, a value of the capacitance is reduced to prevent a maximum current value, and in a duration in which a loop impedance between the gate and the source induces unwanted oscillation phenomena, the value of the capacitance is increased to prevent resonance.

In the technique disclosed in PTL 2, a resonant inductor and a resistor are connected in series between a voltage control terminal of a voltage controlled transistor and a drive circuit. A high drive voltage or a negative voltage is obtained by resonance phenomena caused by L-C-R circuit components with an input capacitance of the voltage controlled transistor. Ringing can be prevented by making the circuit compact and significantly reducing a gate wiring length.

However, in the technique disclosed in PTL 1, switching time is increased in order to increase an input capacitance between the gate and the source.

In the technique disclosed in PTL 2, since the resonant inductor and the resistor are connected in series between the voltage control terminal and the drive circuit, noise immunity is reduced during a period in which the voltage controlled transistor is maintained in an OFF state. Therefore, when noise occurs, malfunction such as erroneous turn-on or parasitic vibration occurs.

In a pair of power semiconductor modules constituting a half bridge circuit in the main circuit of the power conversion device, when one power semiconductor module is switched, the other power semiconductor module is maintained in an OFF state. At this time, when the other power semiconductor module is erroneously turned on, an arm short circuit is caused. Therefore, the problem of the reduction of the noise immunity is remarkable in the power conversion device, the half bridge circuit, and the power semiconductor module.

The problem of malfunction due to the noise is remarkable in a voltage-controlled power semiconductor device capable of high-speed operation, such as an insulated gate bipolar transistor (IGBT) or a metal oxide semiconductor field effect transistor (MOSFET), and a power semiconductor device formed of a wide gap semiconductor such as silicon carbide (SiC) which has a lower loss and excellent higher speed than a power semiconductor device made of silicon (Si).

SUMMARY OF THE INVENTION

Therefore, the invention provides a semiconductor device signal transmission circuit for drive-control, a method of controlling a semiconductor device signal transmission circuit for drive-control, a semiconductor device, a power conversion device, and an electric system for a railway vehicle capable of preventing malfunction due to noise while speeding up or reducing loss of a switching operation.

In order to solve the above problems, the invention provides a semiconductor device signal transmission circuit for drive-control that is connected between a semiconductor device constituting an arm in a power conversion device and a drive circuit configured to drive the semiconductor device, and the semiconductor device signal transmission circuit for drive-control includes: an inductor; and an impedance circuit including a switch and connected in parallel with the inductor.

In order to solve the above problems, the invention provides a method of controlling a semiconductor device signal transmission circuit for drive-control including an inductor connected between a semiconductor device constituting an arm in a power conversion device and a drive circuit configured to drive the semiconductor device, and the method of controlling a semiconductor device signal transmission circuit for drive-control includes: short-circuiting the inductor in a counter arm of the arm when a drive arm of the arm is turned on.

In order to solve the above problems, the invention provides a semiconductor device including an arm in a power conversion device, and the semiconductor device includes a signal transmission circuit for drive-control connected between the arm and a drive circuit configured to drive the arm, in which the signal transmission circuit for drive-control is the semiconductor device signal transmission circuit for drive-control according to the above invention.

In order to solve the above problems, the invention provides a power conversion device including a main circuit having a pair of upper and lower arms and a drive circuit configured to drive the arms, and the power conversion device includes a signal transmission circuit for drive-control connected between the arms and a drive circuit configured to drive the arms, in which the signal transmission circuit for drive-control is the semiconductor device signal transmission circuit for drive-control according to the above invention.

In order to solve the above problems, the invention provides an electric system for a railway vehicle that drives an electric motor configured to drive a railway vehicle, and the electric system for a railway vehicle includes a pantograph; a circuit breaker connected to the pantograph; a reactor connected to the circuit breaker; a power conversion device connected to the reactor; and an electric motor connected to the power conversion device, in which the power conversion device is the power conversion device according to the above invention.

According to the invention, malfunction can be prevented without increasing switching loss of the semiconductor device. Accordingly, reliability of the semiconductor device, the power conversion device, and the electric system for a railway vehicle is improved.

Problems, configurations, and effects other than those described above will be further clarified with the following description of embodiments.

DESCRIPTION OF THE PREFERRED EMBODIMENTS

Figure 1:
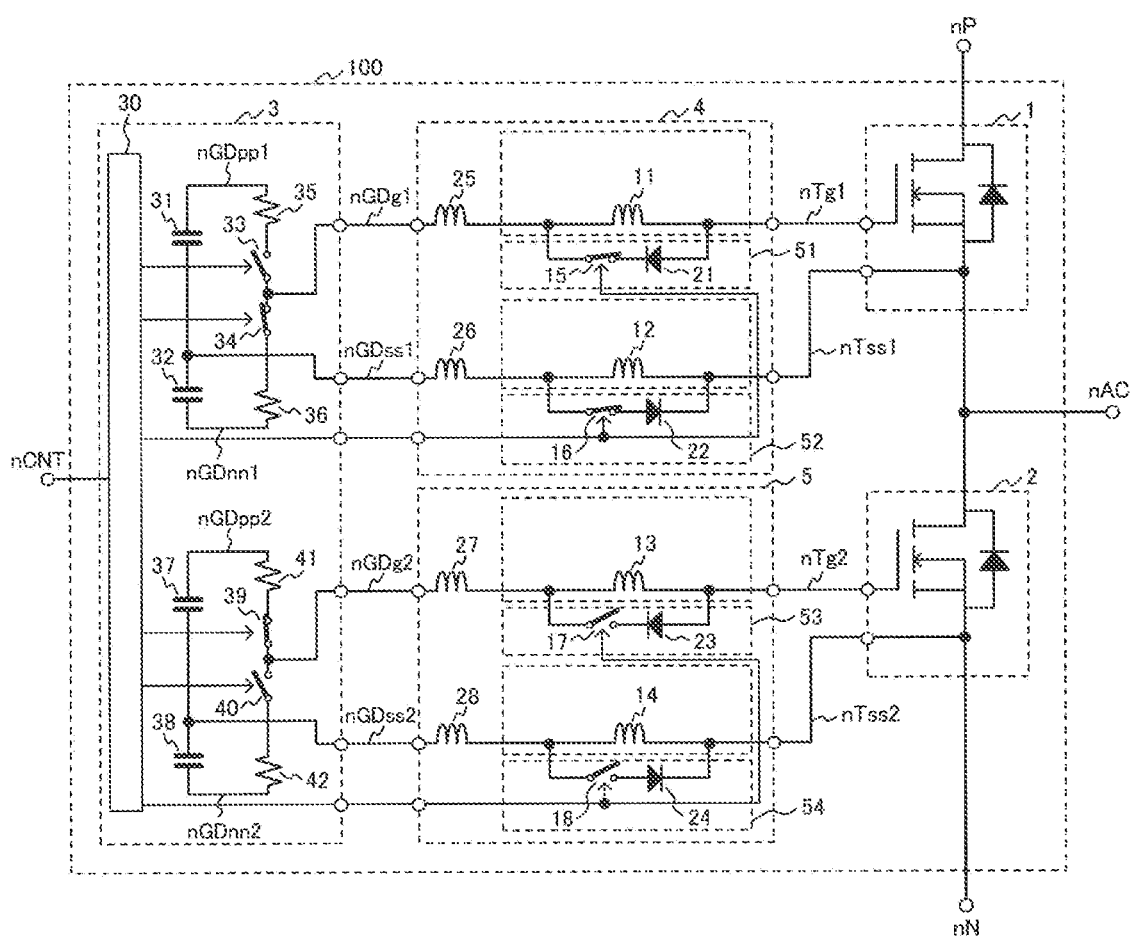
FIG. 1 is a circuit diagram showing a configuration of a power conversion device according to a first embodiment.

Hereinafter, as for embodiments of the invention, a first embodiment to a sixth embodiment will be described with reference to drawings. In the drawings, the same reference numerals denote same constituent elements or constituent elements having similar functions.

First Embodiment

A first embodiment of the invention will be described with reference to FIGS. 1 to 6.

FIG. 1 is a circuit diagram showing a configuration of a power conversion device according to the first embodiment of the invention.

A leg circuit 100 is a component of a power conversion device, for example, a three-phase inverter for an electric railway (see FIG. 7 described later), and includes a semiconductor device, that is, power semiconductor modules 1 and 2 constituting a pair of upper and lower arms, a gate drive circuit 3 for driving the power semiconductor modules 1 and 2, and gate signal transmission circuits 4 and 5 connecting the power semiconductor modules 1 and 2 to the gate drive circuit 3. Here, each of the power semiconductor modules 1 and 2 constitutes one arm formed of a parallel connection circuit of a semiconductor switching element (MOSFET in FIG. 1) and a reflux diode.

The power semiconductor modules 1 and 2 are connected in series with each other to form a half bridge circuit. A high potential DC terminal nP, a low potential DC terminal nN, and an AC terminal nAC of the leg circuit 100 are connected to a high potential side, a low potential side, and an intermediate potential (a series connection point of the power semiconductor modules 1 and 2) of the half bridge circuit, respectively. The high potential DC terminal nP, the low potential DC terminal nN, and the AC terminal nAC are connected to a high voltage DC potential of the power conversion device, a low voltage DC potential of the power conversion device, and a load (for example, an inductive load such as a motor), respectively. An operation of the leg circuit 100 is controlled by a control signal provided from an external control circuit to a control signal terminal nCNT of the leg circuit 100.

The gate drive circuit 3 drives the power semiconductor modules 1 and 2 via the gate signal transmission circuits 4 and 5. The gate drive circuit 3 includes an upper arm drive circuit for driving the power semiconductor module 1 constituting an upper arm, a lower arm drive circuit for driving the power semiconductor module 2 constituting a lower arm, and a drive control circuit 30 that generates a control signal for controlling switches 15 to 18 for switching impedance of an impedance circuit described later.

The gate signal transmission circuits 4 and 5 include gate wirings 25 to 28 (described as inductance components in FIG. 1) for connecting the gate drive circuit 3 with the power semiconductor modules 1 and 2, inductors 11 to 14 for adding a predetermined inductance to the gate wiring, and impedance circuits 51 to 54 respectively connected in parallel to the inductors 11 to 14. The impedance circuits 51 to 54 have a function of changing a value of an impedance of the own impedance circuit by a control signal generated by the drive control circuit 30 and output from the gate drive circuit 3.

In FIG. 1, the gate wirings 25 to 28 are described as the inductance components (wiring inductance), but the gate wirings 25 to 28 have a resistance component (series parasitic resistance) (not shown) connected in series to the inductance components in addition to the inductance components.

An upper arm gate drive terminal nGDg1 of the gate drive circuit 3 is connected to one end of the inductor 11 via the gate wiring 25. The other end of the inductor 11 is connected to a gate terminal nTg1 of the power semiconductor module 1 constituting the upper arm. Regarding a source sense, which is a reference potential for gate drive, an upper arm source sense drive terminal nGDss1 is connected to one end of the inductor 12 via the gate wiring 26, and the other end of the inductor 12 is connected to a source sense terminal nTss1 of the power semiconductor module 1. Since a connection between the power semiconductor module 2 constituting the lower arm and the gate drive circuit 3 is similar as the connection between the power semiconductor module 1 and the gate drive circuit 3, a description thereof is omitted.

Hereinafter, configurations of the gate drive circuit 3 and the gate signal transmission circuits 4 and 5 will be described in more detail with reference to FIG. 1.

The gate drive circuit 3 includes an upper arm drive circuit including circuit elements (31 to 36) and a lower arm drive circuit including circuit elements (37 to 42). As shown in FIG. 1, in the present embodiment, the upper arm drive circuit and the lower arm drive circuit have similar circuit configurations and circuit constants. Therefore, a circuit configuration will be described taking the upper arm drive circuit as an example.

In the upper arm drive circuit, the capacitors 31 and 32 divide a potential difference between power supply nodes nGDpp1 and nGDnn1 of the upper arm drive circuit by a capacitance ratio, and generate a source sense voltage to be provided as a reference voltage to the upper arm source sense drive terminal nGDss1. The resistor 35 and the resistor 36 are an ON gate drive resistor (RgON) and an OFF gate drive resistor (RgOFF) respectively.

The upper arm gate drive terminal nGDg1 is connected to the power supply node nGDpp1 and the power supply node nGDnn1 via the resistor 35 and the resistor 36 by complementarily turning on and off switches 33 and 34. Potentials of the power supply nodes nGDpp1 and nGDnn1 are supplied from the gate drive terminal nGDg1 to the gate signal transmission circuit 4. In FIG. 1, since the switch 33 is in an OFF state and the switch 34 is in an ON state, the gate drive terminal nGDg1 is connected to the power supply node nGDnn1 at a low potential via the resistor 36 (RgOFF). In this case, the power semiconductor module 1 is in an OFF state.

In the lower arm drive circuit, as shown in FIG. 1, since the switch 39 is in the ON state and the switch 40 is in the OFF state, a gate drive terminal nGDg2 is connected to a power supply node nGDpp2 at a high potential via the resistor 41 (RgON). Therefore, the power semiconductor module 2 is in an ON state.

Thus, when one of the power semiconductor modules 1 and 2 is controlled to the ON state, the other is controlled to the OFF state. Accordingly, an overcurrent due to a short circuit of the upper and lower arms is prevented. Of the pair of upper and lower arms, an arm controlled to be in the ON state is referred to as a drive arm, and an arm controlled to be in the OFF state is referred to as a counter arm.

In the present embodiment, the gate signal transmission circuits 4 and 5 have the inductors (11 to 14) and the impedance circuits (51 to 54) connected in parallel to the inductors (11 to 14), as shown in FIG. 1. As shown in FIG. 1, in the present embodiment, the gate signal transmission circuit 4 of the upper arm and the gate signal transmission circuit 5 of the lower arm have similar circuit configurations and circuit constants. Therefore, as shown in FIG. 1, the gate signal transmission circuit 5 of the lower arm when the semiconductor switching element is in the ON state and the gate signal transmission circuit 4 of the upper arm when the semiconductor switching element is in the OFF state will be described.

The impedance circuit 53 includes a diode 23 connected in series to the switch 17. An anode terminal of the diode 23 is disposed on a power semiconductor module 2 side and is connected to a gate terminal nTg2 of the power semiconductor module 2. The impedance circuit 54 includes a diode 24 connected in series to the switch 18. A cathode terminal of the diode 24 is disposed on the power semiconductor module 2 side and is connected to a source sense terminal nTss2 of the power semiconductor module 2.

As shown in FIG. 1, configurations of the impedance circuit 51 and the impedance circuit 52 in the gate signal transmission circuit 4 of the upper arm are similar as those of the impedance circuit 53 and the impedance circuit 54 of the lower arm, respectively.

Since both the switch 17 and the switch 18 in the gate signal transmission circuit 5 of the lower arm as the drive arm are in the OFF state, in a gate drive signal (current) path (ON-gate drive signal (current) path) of the lower arm, the diode 23 and the diode 24 do not function, and the inductor 13 and the inductor 14 provide an inductance component without being short-circuited. Therefore, in the state of FIG. 1, the gate drive signal (current) path of the lower arm sequentially passes through the gate drive terminal nGDg2 of the gate drive circuit of the lower arm in a state of providing an ON-gate signal, the gate wiring 27, the inductor 13, the gate terminal nTg2 of the power semiconductor module 2, the source sense terminal nTss2 of the power semiconductor module 2, the inductor 14, the gate wiring 28 (source sense wiring), and a source sense drive terminal nGDss2 of the gate drive circuit. Therefore, an RLC series circuit includes the gate drive resistor 41 (RgON), inductance components provided by the inductor 13 and the inductor 14, and an input capacitance of the semiconductor switching element in the power semiconductor module 2. In the first embodiment, the inductance components provided by the inductors (13, 14) are sufficiently larger than the inductance components of the gate wirings (27, 28) (the similar applies to the upper arm).

In FIG. 1, a gate drive circuit of the upper arm, which is a counter arm, is operated so that the semiconductor switching element of the power semiconductor module 1 is in the OFF state. In this case, since both the switch 15 and the switch 16 in the gate signal transmission circuit 4 are in the ON state, in a gate drive signal (current) path (OFF-gate drive signal (current) path) of the upper arm, the inductor 11 and the inductor 12 are respectively short-circuited by a diode 21 and a diode 22 and do not function as inductance elements, and the diode 21 and the diode 22 provide a capacitive low impedance. Therefore, in the state of FIG. 1, the gate drive signal (current) path of the upper arm sequentially passes through the source sense drive terminal nGDss1 of the gate drive circuit of the upper arm in a state of providing an OFF-gate signal, the gate wiring 26 (source sense wiring), the switch 16, the diode 22, the source sense terminal nTss1 of the power semiconductor module 1, the gate terminal nTg1 of the power semiconductor module 1, the diode 21, the switch 15, the gate wiring 25, and the gate drive terminal nGDg1 of the gate drive circuit of the upper arm. Therefore, since the inductance component of the gate drive signal (current) path is reduced by an amount of the inductor 11 and the inductor 12, in the gate drive signal (current) path, a capacitance impedance provided by the gate drive resistor 36 (RgOFF), the diode 21 and the diode 22, and the input capacitance of the semiconductor switching element in the power semiconductor module 1 can be regarded as an RC series circuit.

That is, in the first embodiment, in the ON state, the power semiconductor modules (1, 2) are driven by being supplied with a power supply voltage of the gate drive circuit via the RLC series circuit, and in the OFF state, the power semiconductor modules (1, 2) are driven by being effectively supplied with the power supply voltage via the RC series circuit in which the inductance (L) is reduced. The diodes (21 to 24) are connected in parallel to the inductors (11 to 14) via the switches (15 to 18) so that a forward direction thereof is in a direction of an OFF-gate current. In the first embodiment, since the switch is turned on and the inductor is short-circuited by the diode as described above, it is preferable to use a diode having a rated value of a forward voltage (ON-voltage) as low as possible.

When the diode and the inductor are connected in parallel, the inductor is short-circuited by the diode, but in the present embodiment, the switch is connected in series to the diode, and the switch is turned off when the power semiconductor modules (1, 2) are driven to be turned on, so as to release the parallel connection between the diode and the inductor. Accordingly, when the power semiconductor modules (1, 2) are driven to be turned on, resonance between the inductor and a parasitic capacitance of the diode is prevented from occurring.

Next, an operation of the first embodiment will be described.

Figure 2:
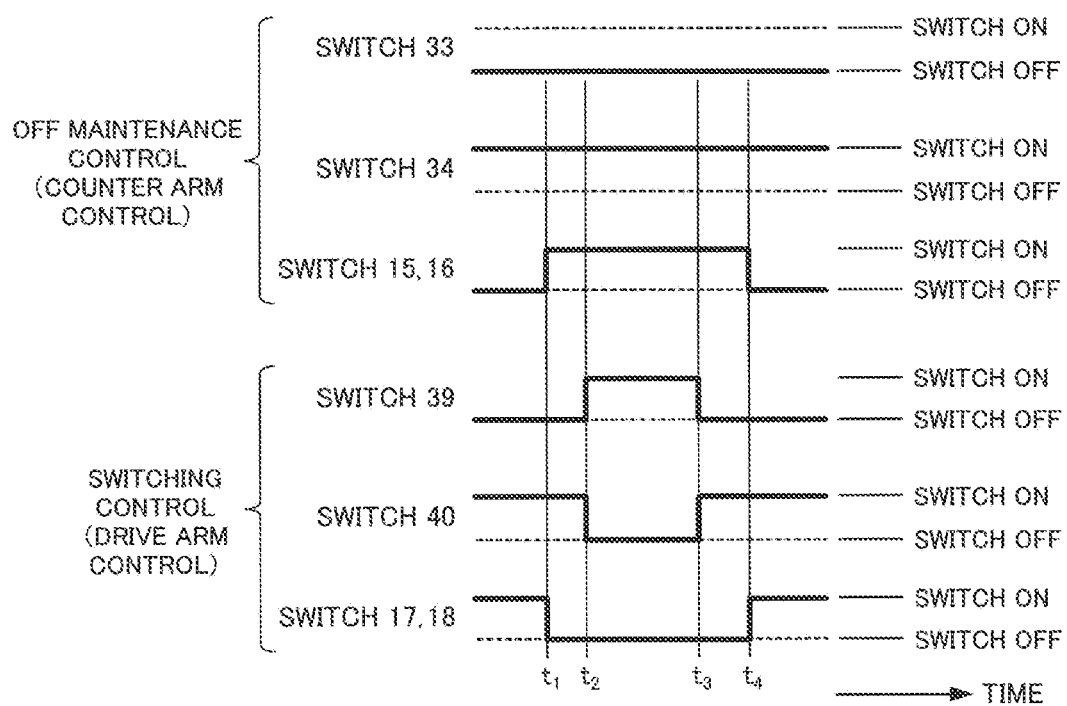
FIG. 2 is a time chart showing an operation of each switch in a gate drive circuit and a gate signal transmission circuit shown in FIG. 1.

FIG. 2 is a time chart showing an operation of each switch in the gate drive circuit and the gate signal transmission circuits shown in FIG. 1.

FIG. 1 shows an example in which the lower arm is the drive arm, the upper arm is the counter arm, the drive arm is controlled to be switched (on and off), and the counter arm is controlled to maintain the OFF state.

Therefore, as shown in FIG. 2, the switch 39 and the switch 40 in the gate drive circuit on a drive arm (lower arm) side are complementarily turned on and off. At a time point t2, the switch 39 and the switch 40 are turned on and off, respectively. Further, at a time point t3, the switch 39 and the switch 40 are turned off and on, respectively. In addition, the switch 33 and the switch 34 in the gate drive circuit on a counter arm (upper arm) side are maintained in an OFF state and an ON state, respectively, so as to maintain the switching element of the counter arm in an OFF state.

Here, in a period up to the time point t2 in FIG. 2, the drive arm (lower arm) is in the OFF state, and a load current does not flow in the drive arm, but a load current flows as a return current to the diode of the counter arm (upper arm). In a period from the time point t2 to the time point t3, the drive arm (lower arm) is in the ON state, and a load current flows through the drive arm (lower arm), but a recovery current transiently flows through the diode of the counter arm (upper arm). In a period from the time point t3 to a time point t4, a state is returned to a state from the time point t1 to the time point t2.

The switches (15 to 18) in the gate signal transmission circuits (4, 5) are controlled to be turned on and off at the time point t1 before the time point t2, and at the time point t4 after the time point t3.

Specifically, at the time point t1 before the time point t2 at which the switch 39 is turned on and the switch 40 is turned off, that is, at a time point (t1) before the switching element of the drive arm (lower arm) is controlled to be turned on, the switch 17 and the switch 18 of the gate signal transmission circuit 5 of the drive arm (lower arm) are turned off, and the switch 15 and the switch 16 of the gate signal transmission circuit 4 of the counter arm (upper arm) are turned on.

Further, at the time point t4 after the time point t3 at which the switch 39 is turned off and the switch 40 is turned on, that is, at a time point (t4) after the switching element of the drive arm (lower arm) is controlled to be turned off, the switch 17 and the switch 18 of the gate signal transmission circuit 5 of the drive arm (lower arm) are turned on, and the switch 15 and the switch 16 of the gate signal transmission circuit 4 of the counter arm (upper arm) are turned off.

According to the ON and OFF control of the switches (15 to 18), in the period (t2 to t3) in which the drive arm (lower arm) is controlled to be turned on and off, the inductors (11, 12) in the gate signal transmission circuit 4 of the counter arm (upper arm) can be reliably short-circuited by the diodes (21, 22). Accordingly, in the period (t2 to t3) in which the drive arm (lower arm) is controlled to be turned on and off, erroneous turn-on of the counter arm (upper arm) can be reliably prevented. In addition, in the gate signal transmission circuit 5 of the drive arm (lower arm), in a state in which the parallel connection between the inductors (13, 14) and the diodes (23, 24) is reliably released, the drive arm (lower arm) can be controlled to be turned on and off. Therefore, the drive arm (lower arm) can be controlled to be turned on and off without impairing a high speed and low loss of the drive arm (lower arm).

Figure 3:
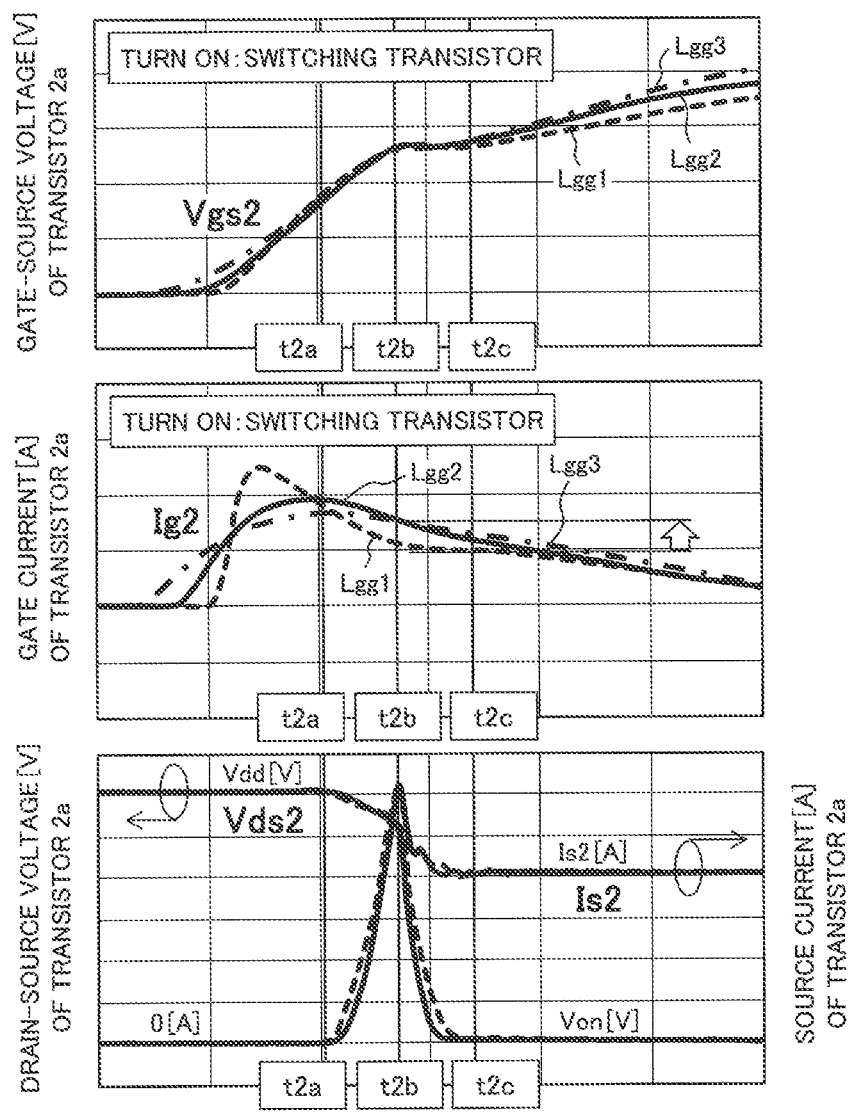
FIG. 3 shows an example of a turn-on waveform of a power semiconductor module showing a circuit operation according to the first embodiment.

FIG. 3 shows an example of a turn-on waveform of a power semiconductor module showing a circuit operation according to the first embodiment. The present waveform example is a result of examination (simulation) by the present inventors.

The waveform example shown in FIG. 3 shows a turn-on operation of the power semiconductor module 2 at a time point when the switching element of the power semiconductor module 2 (described as "transistor 2a" in FIG. 3)

constituting the drive arm (lower arm) is controlled to be turned on, that is, at a time point around the time point t2 in FIG. 2.

In FIG. 3, from the top, a waveform of a gate-source voltage (Vgs2) of the switching element of the power semiconductor module 2, a waveform of a gate current (Ig2) of the switching element, and waveforms of a drain-source voltage (Vds2) and a source current (Is2) of the switching element are shown. A value of a gate loop inductance in the ON-gate drive signal (current) path is referred to as a total inductance value (Lgg1, Lgg2, Lgg3), and is taken as a parameter. Here, Lgg1<Lgg2<Lgg3. In the first embodiment, the inductance components of the inductors (13, 14) are sufficiently larger than those of the gate wirings (27, 28), and the total inductance value is substantially equal to a sum of inductances of the inductor 13 and the inductor 14. Therefore, the total inductance value is changed by inductance values of the inductors (13, 14).

In FIG. 3, waveforms for Lgg1, Lgg2, and Lgg3 are indicated by a broken line, a solid line, and a dashed line, respectively.

Since the switching element of the power semiconductor module 2 is controlled to be turned on, in a period from a time point t2a to a time point t2c, the drain-source voltage Vds2 changes from a high voltage Vdd to a low voltage Von, and the source current Is2 raises from zero (0) to Is2.

In the period from t2a to t2c, the gate-source voltage Vgs2 has substantially the same voltage waveform in cases of Lgg1, Lgg2, and Lgg3.

In contrast, the waveform of the gate current Ig2 varies greatly depending on the total inductance value (Lgg1, Lgg2, Lgg3). In a case of Lgg1, Ig2 has a relatively large current peak value at a time point before t2a, and attenuates significantly after the current peak value; and in a period from t2b to t2c where Vds2 and Is2, that is, a main voltage and a main current change, Ig2 becomes a constant current set by a gate resistor (RgON). Compared with cases of Lgg2 (>Lgg1) and Lgg3 (>Lgg2>Lgg1), Ig2 has a smaller current peak value than in the case of Lgg1, but has a larger gate current value than in the case of Lgg1 in a change period of the main voltage and the main current (t2a to t2c).

This is because when Ig2 is Lgg1, the total inductance value is small, and therefore, an RC transient response due to the gate drive resistor (RgON) and a gate input capacitance of the switching element is dominant, whereas when Ig2 is Lgg2 and Lgg3, a transient response of an RLC series resonant circuit to which Lgg2 and Lgg3 are added becomes dominant.

As described above, in the cases of Lgg2 and Lgg3, since a larger gate current value is obtained than in the case of Lgg1 in the change period of the main voltage and the main current (t2a to t2c), turn-on characteristics (turn-on (fall) time and turn-on loss) can be improved. Here, when comparing the cases of Lgg2 and Lgg3, in a first half period t2a to t2b of the period from t2a to t2c, Ig2 is larger in the case of Lgg2 than in the case of Lgg3, and in a latter half period t2b to t2c, Ig2 is substantially the same in the case of Lgg2 and the case of Lgg3. Therefore, if the total inductance value is increased, the turn-on characteristics can be improved, but as described later, the total inductance value has an optimum value with respect to the turn-on characteristics.

Figure 4:
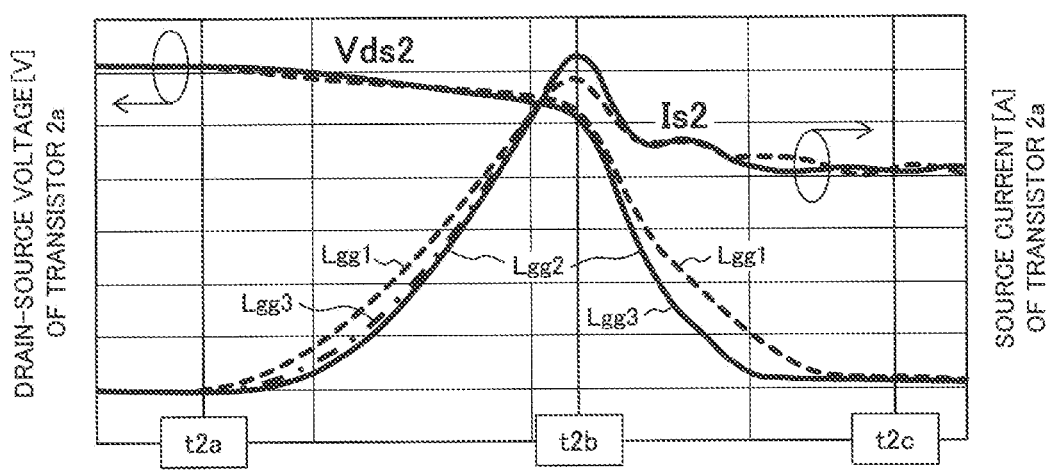
FIG. 4 shows waveforms enlarged in a time axis direction of waveforms of a main voltage (Vds2) and a main current (Is2) in FIG. 3.

FIG. 4 shows waveforms enlarged in a time axis direction of waveforms of the main voltage (Vds2) and the main current (Is2) in FIG. 3.

As shown in FIG. 4, among cases of Lgg1, Lgg2, and Lgg3, Vds2 falls the steepest and Is2 rises the steepest in the case of Lgg2 (Lgg1<Lgg2<Lgg3). In the case of Lgg3, Vds falls steeply similarly as in the case of Lgg2, but the rise of Igs in the period from t2a to t2b is more gradual than that in the case of Lgg2. This is because, as shown in FIG. 3, in the period from t2a to t2b, Ig2 is larger in the case of Lgg2 than in the case of Lgg3.

Figure 5:
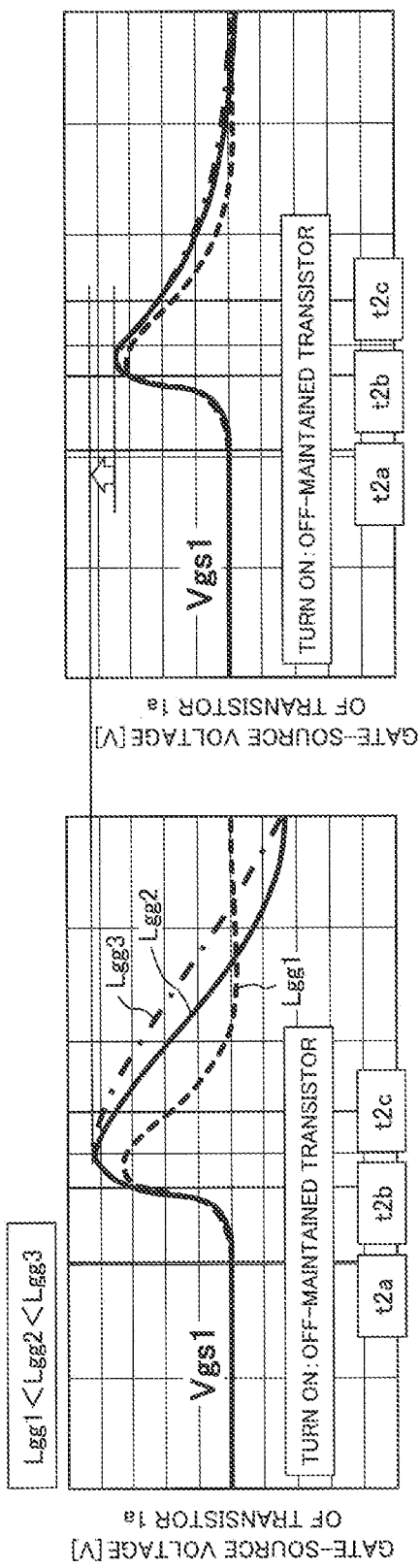
FIG. 5 shows an example of a waveform of a gate-source sense voltage (Vgs1) of the power semiconductor module that maintains an OFF state according to the first embodiment.

FIG. 5 shows an example of a waveform of the gate-source sense voltage (Vgs1) of the power semiconductor module 1 that maintains an OFF state according to the first embodiment. The waveform example of FIG. 5 is a result of examination (simulation) by the present inventors, similar as the waveform example of FIG. 3.

In a left diagram of FIG. 5, a comparative example is shown in which the switch 15 and the switch 16 in the gate signal transmission circuit 4 of the upper arm constituting the power semiconductor module 1 are not controlled to be turned on and off, and are maintained in the OFF state. Accordingly, an inductance component larger than the inductance of the gate wiring is provided to a gate drive signal path of the upper arm by the inductors 11 and 12. Therefore, as shown in the left diagram of FIG. 5, relatively large noise is superimposed on Vgs1 in a positive voltage direction in the period from t2b to t2c in which the lower arm (drive arm) is turned on. The larger the total inductance value (Lgg1<Lgg2<Lgg3), the larger a peak voltage of Vgs1 and the longer a period in which voltage noise is superimposed on Vgs1.

Thus, the noise is superimposed on Vgs1, and Vgs1 is raised accordingly. When Vgs1 exceeds a gate threshold of the switching element of the power semiconductor module 1 in the OFF state, the switching element of the power semiconductor module 1 may be erroneously turned on. When the erroneous turn-on occurs, an arm short-circuit state occurs, and an excessive current occurs in the upper and lower arms.

In contrast, in the first embodiment, as shown in FIG. 2, the switch 15 and the switch 16 of the counter arm (upper arm) are in the ON state, and the inductor 11 and the inductor 12 are short-circuited by the diode 21 and the diode 22 with low impedance, respectively. Vgs1 in this case is shown in a right diagram of FIG. 5. As shown in the right diagram of FIG. 5, even if the total inductance is increased, the inductor and the inductor 12 do not function as an inductance component, and thus noise superimposition in the period from t2b to t2c is prevented.

Figure 6:
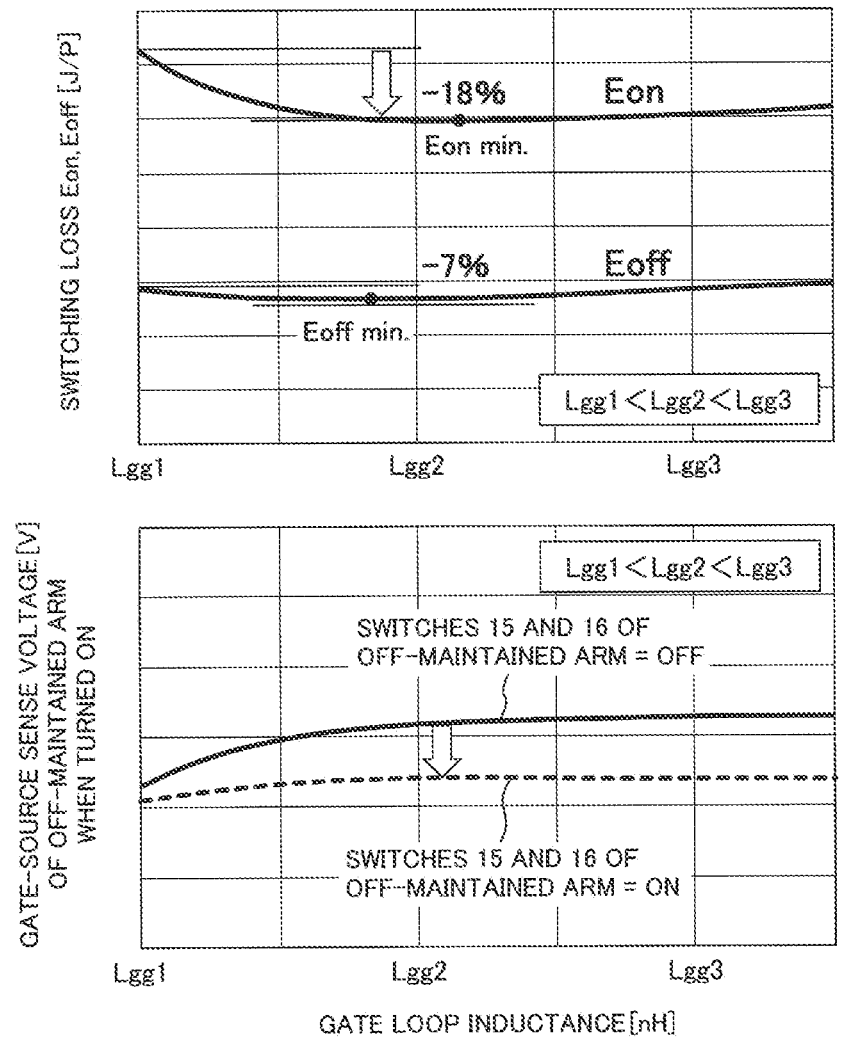
FIG. 6 shows a diagram of a relationship between switching loss and a total inductance value of the power semiconductor module, and a diagram of a relationship between a peak value of the gate-source sense voltage and a total inductance value of a power semiconductor module (lower diagram).

FIG. 6 shows a diagram of a relationship between switching loss and a total inductance value of the power semiconductor module 2 (upper diagram), and a diagram of a relationship between a peak value of the gate-source sense voltage (Vgs1 in FIG. 5) and a total inductance value of the power semiconductor module 1 (lower diagram). These relationships are results of examination (simulation) by the present inventors.

As shown in the upper diagram of FIG. 6, when the total inductance value linearly increases from Lgg1, a turn-on loss Eon decreases by a maximum of 18%, and a turn-off loss Eoff decreases, although a degree of decrease is smaller than that of Eon, by a maximum of 7%. As shown in FIG. 3, there is an optimum value for the total inductance value at which the switching loss becomes the minimum.

Further, as shown in the lower diagram of FIG. 6, the peak value of Vgs1 can be reduced by setting the switch 15 and the switch 16 in the gate signal transmission circuit 4 of the counter arm maintaining the OFF state to the ON state to invalidate the inductor 11 and the inductor 12.

As described above, according to the first embodiment, the diode is connected, via the switch, in parallel to the inductor of the gate signal transmission circuit that connects the gate drive circuit and the power semiconductor module constituting the upper and lower arms included in the power conversion device, and when the drive arm of the upper and lower arms is turned on, the switch is in the ON state and the inductor is short-circuited by the impedance circuit in the counter arm of upper and lower arms, so that the erroneous turn-on can be prevented. Further, when the drive arm is turned on, the switch is in the OFF state to make the inductor not to be short-circuited (in a connected state) in the drive arm, so that the switching characteristics of the power semiconductor module can be prevented from being impaired, for example, the switching loss can be prevented from being increased.

Second Embodiment

Figure 8:
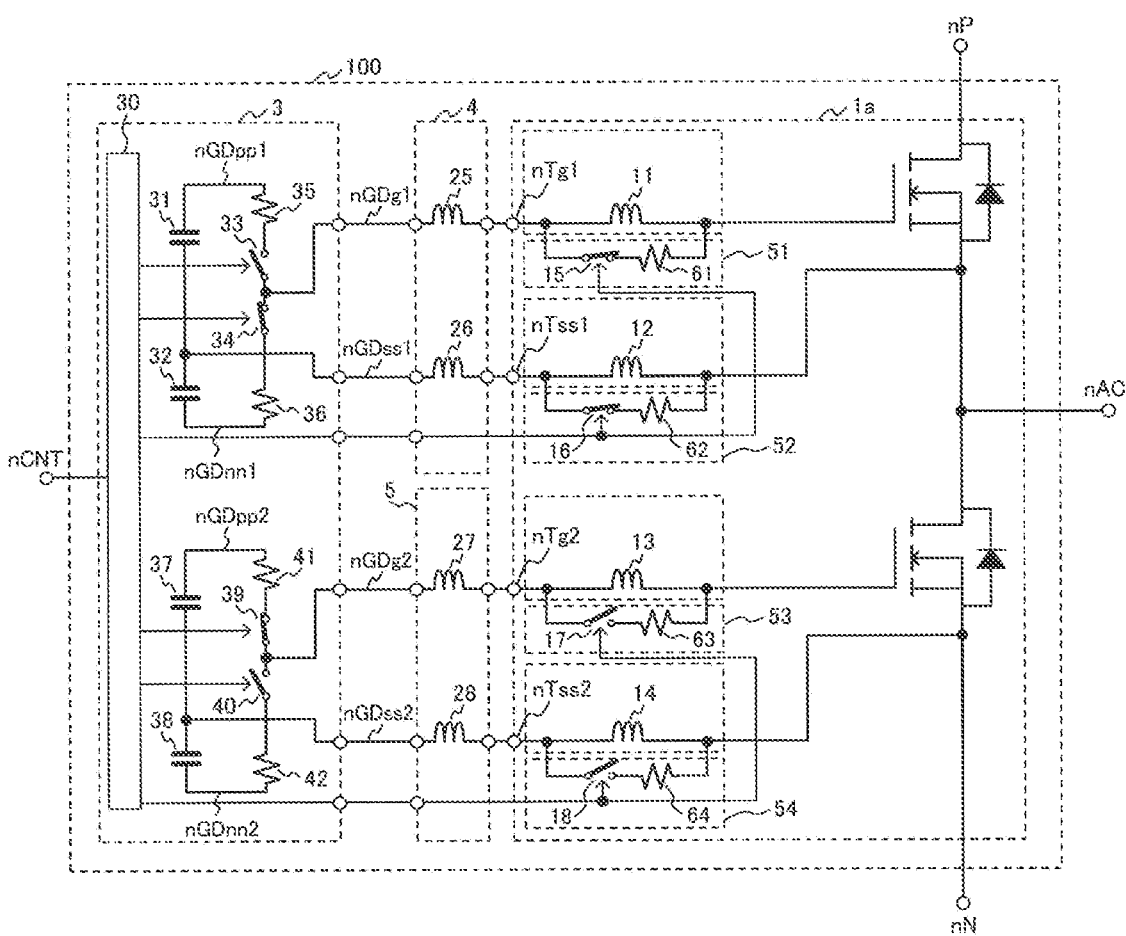
FIG. 8 is a circuit diagram showing a configuration of a power conversion device according to a second embodiment.

FIG. 8 is a circuit diagram showing a configuration of the power conversion device according to a second embodiment of the invention. Differences from the first embodiment will be described below.

In the second embodiment, one power semiconductor module 1a includes a pair of upper and lower arms. Each arm includes a parallel connection circuit of a semiconductor switching element and a reflux diode. That is, the power semiconductor module 1a is a so-called 2-in-1 type. According to such a power semiconductor module 1a, a half bridge circuit including a series connection of two arms can be configured with a short wiring distance in the module. Therefore, since a parasitic inductance (main circuit inductance) of the main circuit in the power conversion device can be reduced, a surge voltage occurred at the time of switching the switching element of the arm can be prevented. Therefore, it is possible to speed up the power semiconductor module.

The power semiconductor module 1a includes inductors (11 to 14) constituting a gate signal transmission circuit connected between switching elements of the upper and lower arms and the gate drive circuit 3, and impedance circuits (51 to 54) connected in parallel to the inductors (11 to 14). Accordingly, the gate signal transmission circuits (4, 5) located between the power semiconductor module and the gate drive circuit 3 becomes only the gate wirings (25 to 28). Therefore, an assembly connection of the leg circuit 100 including the power semiconductor module 1a can be simplified and the number of assembly steps of the power conversion device can be reduced, in combination with the fact that the power semiconductor module 1a is of a 2-in-1 type.

As shown in FIG. 8, the impedance circuits (51 to 54) in the second embodiment are implemented by a series connection of switches (15 to 18) and resistors (61 to 64). A control method of the impedance circuit is similar as that of the first embodiment (FIG. 2).

According to the impedance circuits (51 to 54) in the second embodiment, since the inductor is short-circuited by the resistor, a temperature dependence of impedance of the impedance circuits (51 to 54) can be reduced as compared with the diode. Therefore, even when a temperature of the impedance circuit changes due to heat generation by the switching element of the arm or the like, the inductors (11 to 14) can be short-circuited stably. Therefore, since a margin against the erroneous turn-on is improved, reliability is high, and the erroneous turn-on can be prevented. Further, when the gate signal transmission circuit is built in the power semiconductor module, although it is easily affected by the temperature, since a resistor is used instead of the diode used in the first embodiment, the gate signal transmission circuit can be built in the power semiconductor module without deteriorating the reliability. Here, as long as an influence of the temperature can be tolerated, in the second embodiment, a diode may be used as in the first embodiment instead of the resistor. In addition, in the first embodiment, a resistor may be used as in the second embodiment instead of the diode. Even in such a case, a rectifying effect of the diode cannot be obtained, but an effect of preventing the erroneous turn-on in the counter arm can be obtained.

The resistors (61 to 64) are preferably made of resistors having relatively small temperature dependence, such as polysilicon or a metal coating. In addition, it is preferable to set a value of the resistor such that an inter-terminal voltage of the resistor is equal to or smaller than the ON-voltage of the diode in the first embodiment.

According to the second embodiment described above, similar as in the first embodiment, the erroneous turn-on can be prevented without impairing the switching characteristics of the power semiconductor module. Further, according to the second embodiment, the inductors of the main circuit of the power conversion device can be reduced, and the number of assembly steps of the power conversion device can be reduced. In addition, according to the second embodiment, it is possible to reduce a risk of the erroneous turn-on in the power semiconductor module.

Third Embodiment

Figure 9:
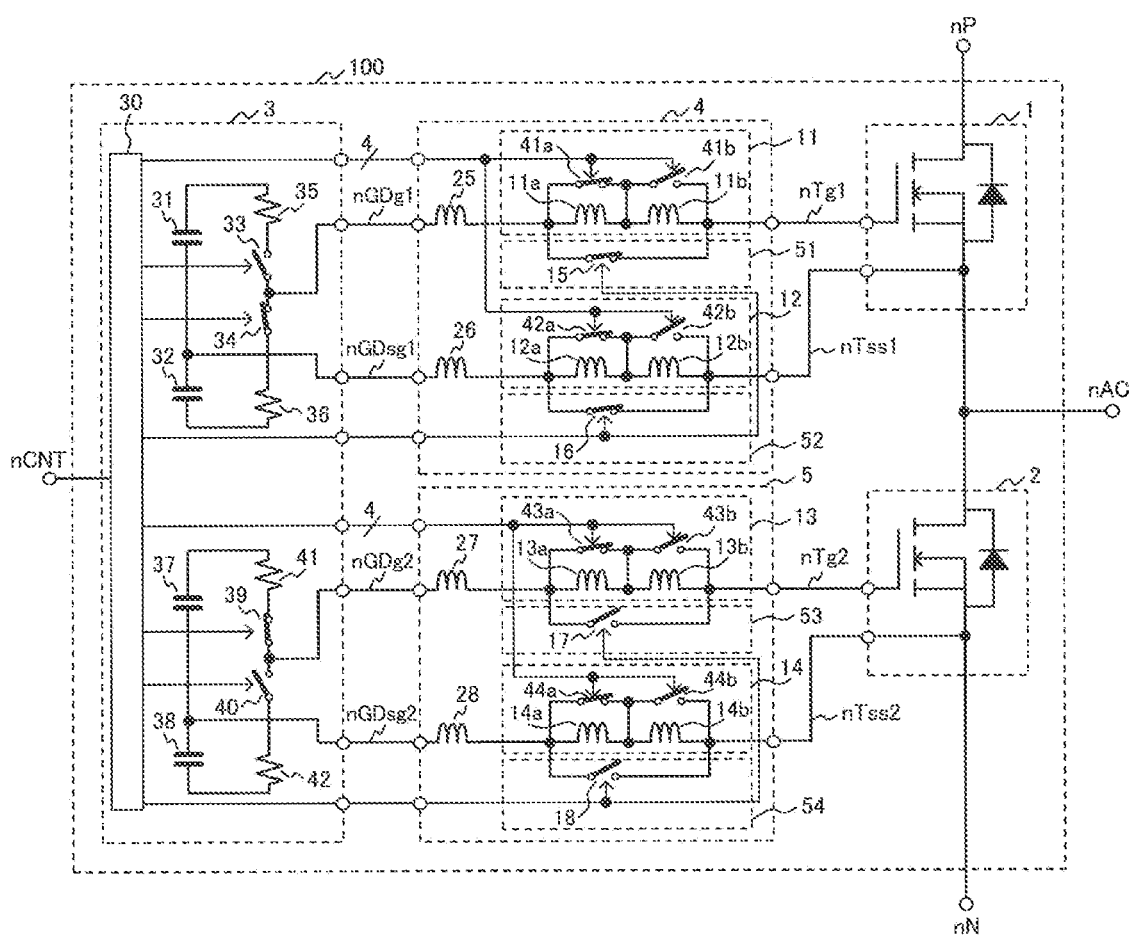
FIG. 9 is a circuit diagram showing a configuration of a power conversion device according to a third embodiment.

FIG. 9 is a circuit diagram showing a configuration of a power conversion device according to a third embodiment of the invention. Differences from the first embodiment will be described below.

In the third embodiment, similar to the gate signal transmission circuit in the first embodiment (FIG. 1), the gate signal transmission circuit includes inductors and impedance circuits (51 to 54) connected in parallel to the inductors. The inductor includes a series circuit of a plurality of (two in FIG. 9) inductors with a switch being connected in parallel to each inductor.

As shown in FIG. 9, in the gate signal transmission circuit 4, an inductor 11a and an inductor 11b are connected in series between nGDg1 and nTg1. A switch 41a and a switch 41b are connected in parallel to the inductor 11a and the inductor 11b, respectively. Further, the switch 15 for short-circuiting a series connection circuit of the inductor 11a and the inductor 11b is connected in parallel to the series connection circuit.

As shown in FIG. 9, in the gate signal transmission circuit 4, an inductor 12a and an inductor 12b are connected in series between nGDsg1 and nTss1. A switch 42a and a switch 42b are connected in parallel to the inductor 12a and the inductor 12b, respectively. Further, the switch 16 for short-circuiting a series connection circuit of the inductor 12a and the inductor 12b is connected in parallel to the series connection circuit.

Wirings for controlling the switches 41a, 41b, 42a, and 42b are collectively shown as four buses in FIG. 9.

A configuration of the gate signal transmission circuit 5 is similar as that of the gate signal transmission circuit 4. A control method of the switches 15 to 18 in the gate signal transmission circuit in the third embodiment is similar as that of the first embodiment (FIG. 2). The diode (see the first embodiment) or the resistor (see the second embodiment) may be connected in series to the switches 15 to 18. In the third embodiment, since the impedance circuits (51 to 54) have only the switches (15 to 18) as circuit elements, the impedance of the impedance circuit when the inductor is short-circuited can be reduced. The diode of the first embodiment and the resistor of the second embodiment may be omitted as in the third embodiment. Even in this case, an effect of preventing the erroneous turn-on in the counter arm can be obtained.

The number of series connections of the inductors is not limited to two shown in FIG. 9, but may be any number.

According to the gate signal transmission circuit of the third embodiment, the value of the inductance of the gate signal transmission circuit can be changed by appropriately controlling switches 41a, 41b, 42a, 42b, 43a, 43b, 44a, and 44b to either the ON state or the OFF state. Accordingly, the inductance of the gate signal transmission circuit can be set to an appropriate value according to characteristics of the power semiconductor module. Therefore, the switching loss of the power semiconductor module can be reliably reduced. In addition, since the gate signal transmission circuit having the same circuit configuration can be applied to power semiconductor modules having a plurality of specifications, versatility of the gate signal transmission circuit is improved.

According to the third embodiment described above, similar as in the first embodiment, the erroneous turn-on can be prevented without impairing the switching characteristics of the power semiconductor module. Further, according to the third embodiment, the switching loss of the power semiconductor module can be reliably reduced. According to the third embodiment, the versatility of the gate signal transmission circuit is improved.

Fourth Embodiment

Figure 10:
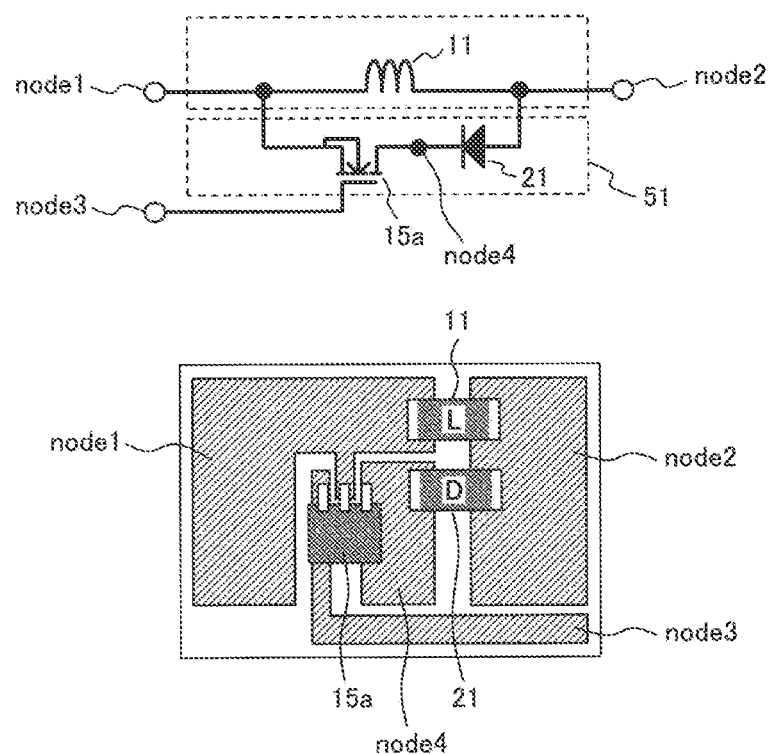
FIG. 10 is a circuit diagram and a plan view showing a configuration of a gate signal transmission circuit board according to a fourth embodiment.

FIG. 10 shows a circuit diagram (upper diagram) and a plan view (lower diagram) showing a configuration of a gate signal transmission circuit board according to a fourth embodiment of the invention.

As shown in the circuit diagram of FIG. 10, a gate signal transmission circuit similar to that of the first embodiment, that is, the inductor 11 and the impedance circuit 51 connected in parallel to the inductor 11, is mounted on the gate signal transmission circuit board according to the fourth embodiment. As shown in the circuit diagram, the impedance circuit 51 includes a series connection of a MOSFET 15a functioning as the switch and the diode 21.

As shown in the plan view of FIG. 10, a gate signal transmission circuit shown in the circuit diagram of FIG. 10 is implemented using a printed circuit board. On the printed circuit board, in the circuit diagram of FIG. 10, node1 on one end of the inductor 11, node2 on the other end of the inductor 11, node3 on a gate terminal of the MOSFET 15a to which a control signal for switching on and off the MOSFET 15a is input, and node4 on a series connection point of the diode 21 and the MOSFET 15a are implemented as a wiring pattern as shown in the plan view in FIG. 10.

As shown in the plan view of FIG. 10, a surface-mounted chip inductor and chip diode are used as the inductor 11 and the diode 21, respectively. As the MOSFET 15a, a surface-mounted discrete MOSFET is used. By using such a circuit component, a size of the gate signal transmission circuit board can be reduced.

Each of these circuit components is bonded to conductor patterns corresponding to node1 to node4 by a conductive adhesive member such as solder via a lead terminal portion. Accordingly, the gate signal transmission circuit board on which the gate signal transmission circuit is mounted is formed on the printed circuit board.

As the gate signal transmission circuit mounted on the gate signal transmission circuit board, any one of the gate signal transmission circuits according to the first to third embodiments described above is applied.

According to the fourth embodiment, it is possible to reduce a space and an area occupied by the gate signal transmission circuit in the power semiconductor module or the power conversion device. Therefore, it is possible to mount the gate signal transmission circuit in the power semiconductor module or the power conversion device while preventing an increase in a size of the power semiconductor module or the power conversion device.

Fifth Embodiment

Figure 11:
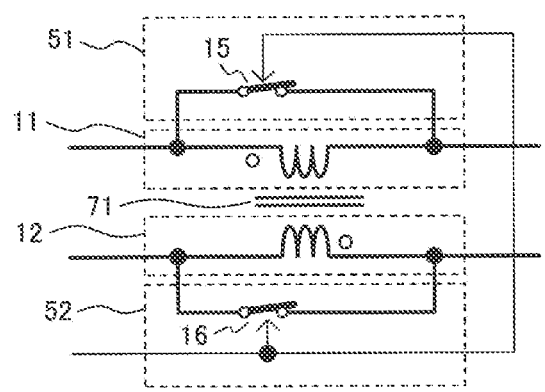
FIG. 11 is a circuit diagram showing a configuration of a gate signal transmission circuit according to a fifth embodiment.

FIG. 11 is a circuit diagram showing a configuration of a gate signal transmission circuit according to a fifth embodiment of the invention.

The inductor 11 and the inductor 12 have the same magnitude of self-inductance and are magnetically coupled (71) to each other by methods such as winding to one magnetic core or coating of a magnetic core material. A direction of magnetic coupling is set so that when an in-phase current flows into the inductor 11 and the inductor 12, the impedance applied to the gate drive signal path by the inductor 11 and the inductor 12 increases, and an in-phase noise removal ratio improves.

According to the fifth embodiment described above, similar as in the first embodiment, the erroneous turn-on can be prevented without impairing the switching characteristics of the power semiconductor module. Further, according to the fifth embodiment, it is possible to reduce an influence of in-phase noise mixed in the gate drive signal path.

Sixth Embodiment

Figure 7:
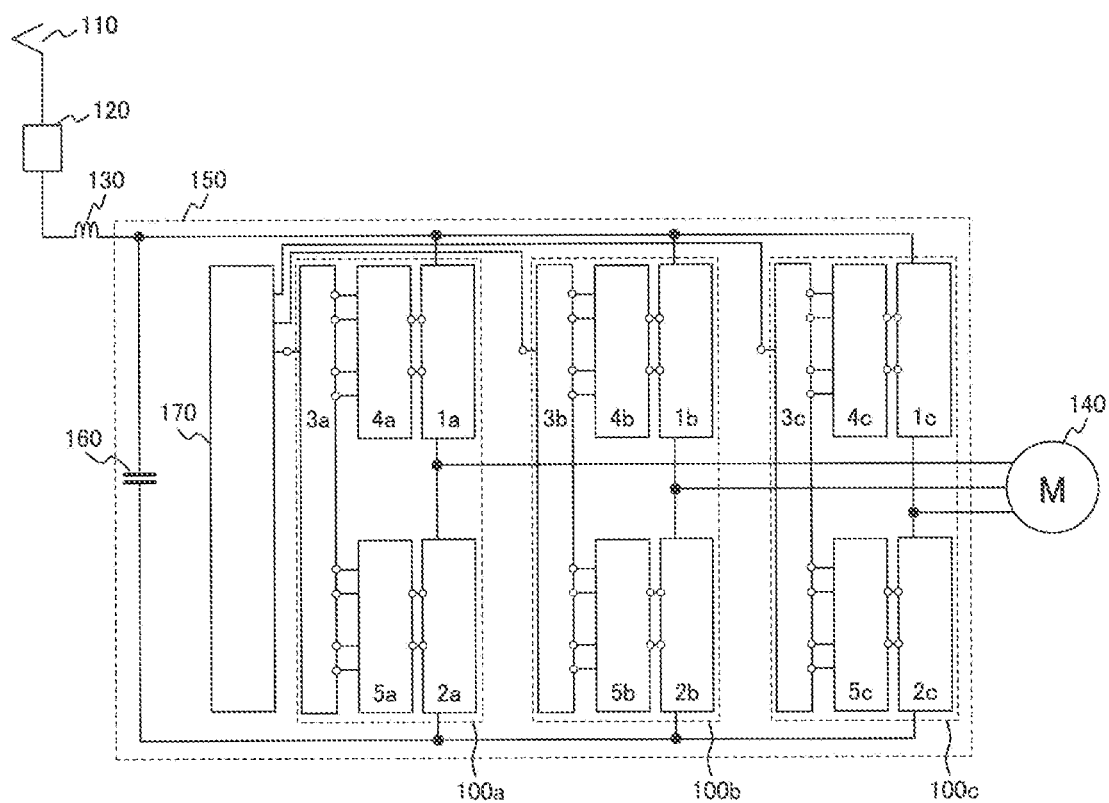
FIG. 7 is a block diagram showing a circuit configuration of an electric system for a railway vehicle according to a sixth embodiment.

FIG. 7 is a block diagram showing a circuit configuration of an electric system for a railway vehicle according to a sixth embodiment of the invention.

The electric system for a railway vehicle according to the sixth embodiment includes a pantograph 110, a circuit breaker 120, a reactor 130, a power conversion device 150, and an electric motor 140 serving as a load. Here, the electric motor 140 is a three-phase AC electric motor that drives a railway vehicle.

The power conversion device 150 includes a leg circuit including a pair of upper and lower arms formed by power semiconductor modules, a capacitor 160, and a control circuit 170. The power conversion device 150 includes three leg circuits 100a, 100b, and 100c equal to the number of AC phases.

The power conversion device 150 holds a main voltage (Vcc) by the capacitor 160, generates control signals to the gate drive circuits 3a, 3b, and 3c by the control circuit 170, and inputs the control signals to the gate drive circuits 3a, 3b, and 3c, respectively.

The leg circuits 100a, 100b, and 100c constitute a first-phase inverter leg, a second-phase inverter leg, and a third-phase inverter leg, respectively. An output of each inverter leg is connected to the electric motor 140.

In the present embodiment, the leg circuits 100a, 100b, and 100c have the same circuit configuration. Therefore, a circuit configuration will be described taking the leg circuit 100a as an example.

The leg circuit 100a includes a pair of upper and lower arms formed by power semiconductor modules 1a and 2a connected in series, a gate drive circuit 3a for controlling ON and OFF of the power semiconductor modules 1a and 2a, a gate signal transmission circuit 4a connected between the gate drive circuit 3a and a gate terminal as well as a source sense terminal of the power semiconductor module 1a, and a gate signal transmission circuit 5a connected between the gate drive circuit 3a and a gate terminal as well as a source sense terminal of the power semiconductor module 2a. As the gate signal transmission circuits 4a and 5a, the gate signal transmission circuits according to the first to fifth embodiments described above are applied.

According to the sixth embodiment, it is possible to prevent malfunction of the power conversion device and the electric system for a railway vehicle due to the erroneous turn-on of the power semiconductor module without impairing the switching characteristics in the power conversion device or the electric system for a railway vehicle. Therefore, the reliability of the power conversion device and the electric system for a railway vehicle is improved. In addition, since the switching loss of the power semiconductor module is reduced and heat generation is reduced, a size of a heat sink provided in the power conversion device can be reduced. Therefore, it is possible to reduce the size of the power conversion device and the electric system for a railway vehicle.

The invention is not limited to the above embodiments, and includes various modifications. For example, the embodiments described above have been described in detail for easy understanding of the invention, and are not necessarily limited to those including all the configurations described above. A part of the configuration of each embodiment may be added to, deleted from, or replaced with another configuration.

For example, a circuit constant value and a form of the resistor and the inductor in the impedance circuit may be set freely. In addition to the MOSFET, a unipolar device such as a junction field effect transistor (JFET) type or a bipolar device such as an IGBT may be used as the switching element constituting the upper and lower arms. In addition, the configuration of the parallel connection between the semiconductor switching element and the reflux diode is not limited thereto, and when the semiconductor switching element is a MOSFET, a body diode built in the MOSFET may be used instead of the reflux diode. Similarly, various unipolar devices and bipolar devices can be applied to switches in the impedance circuit and the gate drive circuit. In addition to the above-described "drain" and "source", a main terminal is also referred to as a "collector" and an "emitter", depending on the device.

In addition to 1-in-1 and 2-in-1 type, the form of the power semiconductor module may include a three-phase full-bridge circuit constituting the main circuit of the power conversion device.

The power conversion device to which the gate signal transmission circuit is applied can also be applied to a power conditioning system (PCS) in a solar power generation device or an electric vehicle in addition to the electric system for a railway vehicle.

What is claimed is:

1. A semiconductor device signal transmission circuit for drive-control that is connected between a semiconductor device constituting an arm in a power conversion device and a drive circuit configured to drive the semiconductor device, the semiconductor device signal transmission circuit for drive-control comprising:
    an inductor; and
    an impedance circuit including a switch and connected in parallel with the inductor, wherein
    when a drive arm of the arm is turned on, in a counter arm of the arm, the switch is in an ON state, and the impedance circuit short-circuits the inductor,
    the impedance circuit includes a series circuit of the switch and a diode, and
    the impedance circuit short-circuits the inductor with the diode.

2. The semiconductor device signal transmission circuit for drive-control according to claim 1, wherein
    when the drive arm of the arm is turned on, the switch is in an OFF state in the drive arm.

3. A semiconductor device including an arm in a power conversion device, the semiconductor device comprising:
    a signal transmission circuit for drive-control connected between the arm and a drive circuit configured to drive the arm, wherein
    the signal transmission circuit for drive-control is the semiconductor device signal transmission circuit for drive-control according to claim 1.

4. A power conversion device including a main circuit having a pair of upper and lower arms and a drive circuit configured to drive the arms, the power conversion device comprising:
    a signal transmission circuit for drive-control connected between the arms and a drive circuit configured to drive the arms, wherein
    the signal transmission circuit for drive-control is the semiconductor device signal transmission circuit for drive-control according to claim 1.

5. An electric system for a railway vehicle that drives an electric motor configured to drive a railway vehicle, the electric system for a railway vehicle comprising:
    a pantograph;
    a circuit breaker connected to the pantograph;
    a reactor connected to the circuit breaker;
    a power conversion device connected to the reactor; and
    an electric motor connected to the power conversion device, wherein
    the power conversion device is the power conversion device according to claim 4.

6. A semiconductor device signal transmission circuit for drive-control that is connected between a semiconductor device constituting an arm in a power conversion device and a drive circuit configured to drive the semiconductor device, the semiconductor device signal transmission circuit for drive-control comprising:
    an inductor;
    an impedance circuit including a switch and connected in parallel with the inductor;
    a first inductor and a second inductor connected in series with each other as the inductor;
    a first switch connected in parallel to the first inductor; and
    a second switch connected in parallel to the second inductor.

7. The semiconductor device signal transmission circuit for drive-control according to claim 6, wherein
    the impedance circuit includes a series circuit of the switch and a resistor, and
    the impedance circuit short-circuits the inductor with the resistor.

8. The semiconductor device signal transmission circuit for drive-control according to claim 6, wherein
    the impedance circuit short-circuits the inductor with the switch.

* * * * *